United States Patent [19]

Buckley

[11] 3,877,049

[45] Apr. 8, 1975

[54] ELECTRODES FOR AMORPHOUS SEMICONDUCTOR SWITCH DEVICES AND METHOD OF MAKING THE SAME

[76] Inventor: William D. Buckley, 1035 Kirk Rd., Troy, Mich. 48084

[22] Filed: Nov. 28, 1973

[21] Appl. No.: 419,633

[52] U.S. Cl. ................. 357/2; 340/173 SP; 357/48; 357/67; 357/71

[51] Int. Cl. ............................................ H01l 19/00

[58] Field of Search ........ 317/234 V, 235 E, 234 L, 317/234 N; 357/2, 67, 71

[56] References Cited

UNITED STATES PATENTS

| | | | |
|---|---|---|---|
| 3,274,670 | 9/1966 | Lepselter | 317/234 L |
| 3,431,472 | 3/1969 | Castrucci et al. | 317/234 R |
| 3,432,729 | 3/1969 | Dyre | 317/234 V |
| 3,458,778 | 7/1969 | Genzabella et al. | 317/234 L |
| 3,525,146 | 8/1970 | Hayashida et al. | 317/234 L |
| 3,611,063 | 10/1971 | Neale | 317/234 V |
| 3,648,081 | 3/1972 | Lean et al. | 357/2 |
| 3,653,120 | 4/1972 | Sirrine et al. | 317/235 AT |
| 3,656,032 | 4/1972 | Henisch | 357/2 |
| 3,699,543 | 10/1972 | Neale | 317/235 E |
| 3,796,931 | 3/1974 | Maute | 317/234 N |

*Primary Examiner*—Stanley D. Miller, Jr.
*Assistant Examiner*—William D. Larkins
*Attorney, Agent, or Firm*—Wallenstein, Spangenberg, Hattis & Strampel

[57] ABSTRACT

In a semiconductor switch device wherein upon the application of a voltage in excess of the threshold voltage value at least one current conducting filamentous path is formed of relatively low resistance, there is provided one or more electrodes comprising a single crystal of conductive material which has a smooth face contacting the amorphous semiconductor material. The single crystal electrode is preferably formed as an epitaxial layer on a single silicon chip substrate and by a process which includes vapor or sputter depositing an electrode-forming material, preferably palladium, upon the unheated exposed areas of the silicon substrate. A subsequent annealing process grows a single crystal epitaxial layer of the deposited palladium and the silicon on the substrate. The semiconductor material forming the switch device is then directly deposited on this epitaxial layer.

10 Claims, 3 Drawing Figures

ELECTRODES FOR AMORPHOUS SEMICONDUCTOR SWITCH DEVICES AND METHOD OF MAKING THE SAME

BACKGROUND OF THE INVENTION

The present invention relates to electrodes for amorphous semiconductor switch devices particularly of the type which, generally in their most useful commercial form, include as the active switch-forming portion thereof glassy materials of one or more of the chalcogenide elements (sulfur, selenium or tellurium) in combination with various other materials like silicon, arsenic, antimony, bismuth, germanium and the like.

Chalcogenide amorphous semiconductor materials have been used in recent years for the manufacture of two types of switching devices, one of which devices is sometimes referred to as a threshold switch device and the other of which is sometimes referred to as a memory switch device. Such devices are disclosed in U.S. Pat. No. 3,271,591 to S. R. Ovshinsky granted Sept. 6, 1966. When a film of such chalcogenide material extends between two suitable ohmic contact-forming electrodes, the application of electrical pulses of the correct energy time profile can cause the structure to display either a high or a low resistance, with a resistance ratio at least from about $10^3$ to $10^4$. In its high resistance or relatively non-conductive state, these devices have resistivities in the range from about $10^3$ to $10^{12}$ ohm-centimeters, and in their low resistance or conductive states they commonly have resistivities in the range of from about 10 to $10^{-6}$ ohm-centimeters.

The threshold switch devices are driven into a low resistance or conductive state by a voltage in excess of a given threshold voltage value and remain in their conductive states until the current flow therethrough drops below a given holding current value. Examples of chalcogenide materials used in threshold switch devices include compositions of (a) 40 tellurium, 35% arsenic, 18% silicon, 6.75% germanium and 0.25% indium and (b) 28% tellurium, 34.5% arsenic, 15.5% germanium and 22% sulfur.

Memory switch devices are driven into a low resistance or conductive state by a set voltage pulse in excess of a given threshold voltage value and remain in their conductive states even after all sources of energy are removed therefrom, and are resettable to their relatively non-conductive state by application of a reset current pulse, as explained in the aforesaid U.S. Pat. No. 3,271,591. The set voltage pulse which sets a memory device-forming material is generally a pulse of milliseconds duration. A reset pulse is a very short current pulse lasting generally less than about 6 microseconds in duration. Memory switch semiconductor materials are vitreous semiconductor materials which are reversibly changed between two stable structural states generally between relatively disordered or amorphous and relatively ordered crystalline states. Their compositions are at the border of the glass regions, and are generally binary compositions of tellurium and germanium with germanium comprising generally greater than 10% of the composition or compositions like this including additional elements of group V or VI of the periodic table. Examples of memory material compositions are (a) 15% (atomic) germanium, 81% tellurium, 2% antimony and 2% sulfur; and (b) 83% tellurium and 17% germanium.

In both threshold and memory switch devices, a set voltage pulse in excess of a threshold voltage value causes set current to flow in a small filament (generally under 10 microns in diameter). In the memory switch device, the set current pulse which flows in believed to heat the semiconductor material above its glass transition temperature where sufficient heat accumulates under its relatively long duration that upon cessation thereof a slow cooling of the material results which effects crystallization of the material in the filament due to the tendency of the composition involved to crystallize, unlike the threshold switch compositions. The crystallized low resistance filament remains indefinitely, even when the applied voltage and current are removed, until reset to its initial amorphous high resistance condition, as by the feeding of one or more short duration reset current pulses therethrough. Each reset current pulse may heat all or portions of the filament, and portions of the semiconductor material beyond the limits of the filament, to a critical temperature above the glass transition temperature of the material. When a short reset current pulse is terminated, such heated portions cool and returns to a generally amorphous state. As previously indicated, when current flow ceases in a threshold device, the low resistance filament remains in its original amorphous high resistance condition.

Once a threshold or memory switch device has been rendered conductive and has been reset to its initial high resistance condition, subsequent set current pulses will generally flow in the identical location of the first filament, unless the amorphous semiconductor material is significantly modified in some way. The consistency of filament location is a factor in stabilizing the operating characteristics of the threshold memory switch involved.

The nature of the electrode material applied to the amorphous semiconductor material of a threshold or memory switch device must be carefully selected to avoid adverse affects upon the characteristics of the amorphous semiconductor material. For example, an aluminum electrode applied directly to the amorphous semiconductor material of such a switch device can adversely affect the composition of the semiconductor material where the electrode is positive with respect to the semiconductor material because it then diffuses into the amorphous semiconductor material adversely to modify the same. Also, aluminum frequently presents a rough surface to the semiconductor material, and a rough interface between an electrode and an amorphous threshold or memory switch-forming semiconductor material is undesirable because it can produce undesirable hot spots and characteristic variations between desirably near identical threshold or memory switch devices and can promote undesired crystallization of the amorphous semiconductor material. When aluminum outer electrodes or terminals are desired, it has been the practice to separate each of the same from the amorphous semiconductor material of a threshold or memory switch device by an intervening barrier-forming layer which was generally a refractory metal like molybdenum which does not diffuse into the semiconductor material. Originally, the molybdenum layer was deposited in a macropolycrystalline refractory metal layer between the aluminum outer electrode, and the amorphous semiconductor material had a tendency to alter the deisred electrical characteristics of the semiconductor material because, while it did not present as rough a surface as aluminum frequently presents to the amorphous semiconductor material, it still presents a surface which is rough relative to amorphous materials.

In accordance with the teachings of U.S. Pat. No. 3,611,063, special care is taken in the deposition of the molybdenum or other refractory barrier-forming layer by controlling the temperature of the amorphous semiconductor substrate such that it is deposited in an amorphous state (that is, a state which is not a macrocrystalline and so includes a purely amorphous or quasi-amorphous micro-polycrystalline state where the crystals are of such small size as not to be readily detectable by ordinary crystal structure detecting equipment). With such amorphous barrier-forming layers, the characteristics of the amorphous semiconductor material is stabilized.

As disclosed in co-pending application Ser. No. 396,497 filed Sept. 12, 1973, the use of amorphous refractory metal barrier-forming layers in the electrode structures of threshold and memory switch devices in thicknesses, for example, of 0.23 microns and greater was discovered to be a contributing influence in the bulging or cracking of the electrode layers, which destroyed the utility of the switch devices. It was discovered that the bulging and cracking of the electrodes was due, in part, to the large stresses applied to the barrier-forming layers of the electrodes during current flow therethrough. These stresses reached damage-producing levels because where relatively thick barrier-forming layers are deposited they are placed under substantial stresses due to the low coefficient of expansion thereof in comparison to that of the amorphous semiconductor material. The stresses added by the heating effects of current flow causes the bulging and cracking thereof referred to. This difficulty was alleviated by applying the molybdenum layers in thicknesses of about 0.15 microns or less, or by using specially controlled deposition equipment which can deposit thicker films of the material in a stress or near stress-free state.

It is an object of the present invention to provide a new and improved electrode which is to make direct contact with the amorphous semiconductor material of a threshold or memory switch device as described, and which can be readily formed in thin or thick layers in a stress-free state without any specially controlled deposition equipment.

There has been developed a memory matrix utilizing the non-volatile resettable characteristic of the memory switch device. Such a memory matrix has been integrated onto a silicon chip substrate as disclosed in U.S. Pat. No. 3,699,543 granted Oct. 17, 1972 to Ronald G. Neale. As disclosed in the latter patent, the matrix is formed within and on a semiconductor substrate, such as a silicon chip, which is doped to form spaced, parallel X or Y axis conductor-forming regions within the body. The substrate is further doped to form isolating rectifier elements for each active cross-over point. The rectifier elements have one or more terminals exposed through apertures in an outer insulating layer on the substrate. An aluminum contact-forming deposit followed by a deposit of amorphous molybdenum are formed selectively in and over each aperture by a photoresist masking and etching process. In a similar way, a layer of amorphous memory semiconductor material is formed over each amorphous molybdenum layer and in turn is overlaid by amorphous molybdenum and aluminum layers to complete the formation of a deposited memory switch device at each cross-over point of the matrix. Y or X axis bands of conductive material which are extensions of the upper aluminum electrodes are formed to complete the matrix.

Another object of the invention is to provide a unique electrode for a threshold or memory semiconductor switch device as described, which forms a single layer interface between the amorphous semiconductor layer and exposed doped portions of a silicon semiconductor substrate so as to eliminate the need for both layers of aluminum and a refractory metal layer between the amorphous semiconductor layer and the silicon semiconductor substrate.

A still further object of the present invention is to provide a unique process for applying said single layer of electrode-forming material which interfaces the amorphous memory semiconductor material and said silicon semiconductor substrate which process can be carried out at low temperatures.

SUMMARY OF THE INVENTION

In accordance with one of the aspects of the present invention, many of the advantages of an amorphous refractory metal electrode for an amorphous threshold or memory switch-forming semiconductor material are achieved with additional important advantages by using as an ohmic contact-forming electrode material a single crystal of conductive material compatible with the switch-forming semiconductor material. Most advantageously, the electrode is a noble or platinum metal containing crystal, most preferably palladium silicide ($Pd_2Si$) grown on a silicon chip substrate as an epitaxial layer. Such a single crystal electrode presents an ideal smooth surface contacting the amorphous switch-forming semiconductor material and is compatible with, and can act as a single layered interface between the switch device formed by a deposited film of the amorphous semiconductor switch-forming material and a silicon chip or similar semiconductor substrate in which various circuit elements may be integrated by well-known doping techniques.

While palladium silicide has heretofore been suggested for use as a contact terminal-forming material in the apertures of silicon chip substrates of integrated circuits, it was not heretofore appreciated that such palladium silicide contact terminals had a single crystal structure (and in fact may not have been a single crystal terminal because of the process conditions under which they were formed), or was useful as an electrode material for amorphous threshold and memory semiconductor materials. It has generally been thought that to achieve a single crystal from a vapor or sputter deposition of metals requires very special conditions, and that normally such a single crystal deposition is not anticipated.

On pages 507–513 of Volume 14 of the 1971 Edition of *Solid State Electronics*, C. J. Kircher discloses a process for forming contacts of palladium silicide in the apertures of a silicon chip substrate. In the process disclosed therein, palladium is first sputter deposited upon a single crystal silicon wafer heated to 200°C, and the deposited palladium is then preferably heated to 500°C for 20 minutes. U.S. Pat. No. 3,431,472 granted Mar. 4, 1969 discloses the use of palladium silicide contacts obtained by vapor depositing palladium on a silicon substrate heated to a temperature of 400°F and then annealing the same at a temperature of preferably 932°F. The advantage in using palladium silicide as a contact terminal on a silicon chip substrate is that the terminal can be readily formed only in the aperture of the substrate without the need for complicated photoresist masking processes, since etchants are available which will etch away the palladium deposit on the insulating layer of the silicon chip substrate without affecting the palladium silicide formed within the aperture of the substrate. However, as above indicated, in neither of these references which disclose the use of palladium silicide as contact terminals on silicon substrates is there any indication that a single crystal is obtained or that palladium silicide contact terminals on the silicon chip substrate has any utility as an electrode for amorphous threshold or memory semiconductor devices.

In accordance with another aspect of the invention, it was unexpectedly discovered that a single crystal palladium silicide epitaxial layer is obtained within the exposed doped region in an aperture of a silicon chip substrate by vapor or sputter depositing palladium thereon at nominally room temperatures, rather than at the much higher temperatures specified in the *Solid State Electronics* article and in U.S. Pat. No. 3,431,472 referred to previously. The use of high temperatures is undesirable because it can adversely affect the single crystal formation and the vapor or sputter depositing equipment needed in the process becomes more expensive and difficult to use. By nominally at room temperature is meant that the substrate is not externally heated, although the actual temperature of the substrate due to the bombardment thereof by the materials which strike the same during the vapor or sputter deposition process may heat the same to temperatures above room temperature. To produce a single crystal epitaxial layer of palladium silicide under such low temperature conditions (such as at the nominal room temperature referred to) is extraordinary and unexpected. It was also unexpectedly discovered that the single crystal palladium silicide epitaxial layer could be grown to a desired thickness by annealing the same for a short period in an oven at a modest elevated temperature, such as for 10 minutes at a temperature of from 200°–300°C.

DESCRIPTION OF PREFERRED EMBODIMENT OF INVENTION

Figure 1:
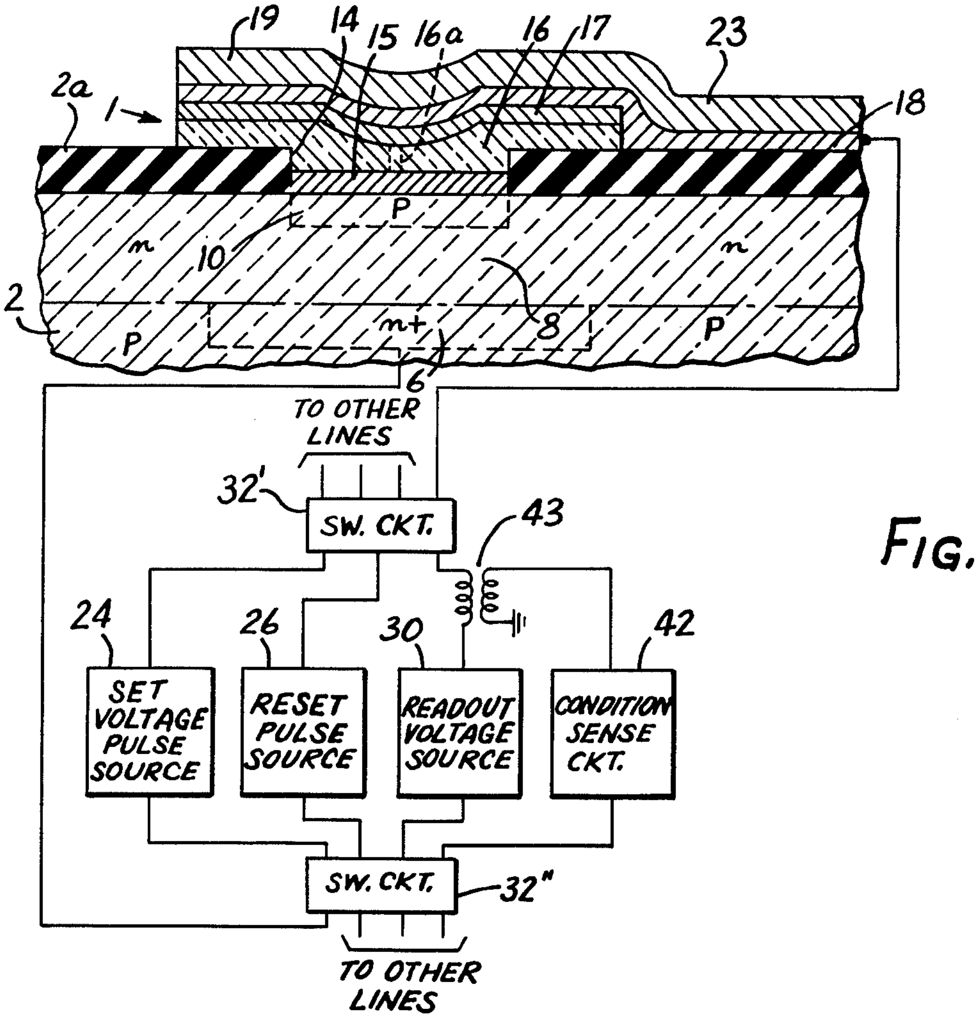
FIG. 1 illustrates a sectional view through a memory device and a doped silicon chip substrate on which it is formed, together with various switching means and voltage sources for setting, resetting and reading out the resistance conditions of the memory device, all forming part of an $x$–$y$ memory matrix system.

FIG. 1 shows a memory switch device 1 deposited upon a substrate 2 where it connects to one or more conductive areas on the substrate forming connecting points to any desired electrical circuit. As illustrated, the substrate is a silicon chip (i.e., single crystal) substrate which together with numerous other memory devices (not shown) form an $x$–$y$ memory matrix, such as disclosed in U.S. Pat. No. 3,699,543 where $x$ or $y$ axis conductors are formed in the body of the silicon chip substrate 2. One of these $x$ or $y$ axis conductors is indicated by a doped $n$ plus region 6 in the substrate 2, which region is immediately beneath an $n$ region 8, in turn, immediately beneath a $p$ region 10. The $p$–$n$ regions 10 and 8 of the silicon chip 2 form a rectifier which, together with the memory device 1, are connected between one of the cross-over points of the $x$–$y$ matrix involved.

The silicon chip 2 has grown thereon a film 2*a* of silicon dioxide. This silicon dioxide film is provided with apertures like 14 each of which initially expose a $p$ region 10 of the semiconductor material of the silicon chip above which point a memory switch device 1 is to be located. A unique single crystal inner electrode layer 15 for the memory switch device 1 is grown over each exposed portion of the silicon chip in each aperture 14. As previously indicated, this single crystal layer is most desirably a noble or platinum metal-containing single crystal such as a silicide of such a metal, preferably palladium silicide. Most advantageously, this layer is palladium silicide grown as an epitaxial layer on the silicon chip.

The active portion of each memory switch device is a layer 16 of amorphous memory semiconductor material centered over each aperture 14 in the insulating film 2*a* where the memory semiconductor material extends into the aperture 14. The memory semiconductor layer 16, as previously indicated, is most preferably a chalcogenide material having as major elements thereof tellurium and germanium, although the actual composition of the memory semiconductor material useful for the memory semiconductor layer 16 can vary widely in accordance with the broader aspects of the invention. As previously indicated, such a single crystal electrode layer 15 does not chemically react with or diffuse into threshold or memory switch-forming amorphous semiconductor materials and presents a smooth face thereto. Also, it is formed in a stress-free state and in a manner where it occupies only the area encompassed by an aperture 14 without the need of any masking operation.

The memory switch device 1 has applied to the outer face thereof to stabilize the threshold voltage thereof after a small number of set and reset cycles an enriched region of the element which normally migrates towards the adjacent electrode, namely in the tellurium-germanium composition involved an enriched area of tellurium. By an enriched region of tellurium is meant tellurium in much greater concentration that such tellurium is found in the semiconductor composition involved. This can be best achieved by forming a layer 17 of crystalline tellurium upon the entire outer surface of the memory semiconductor layer 16. With the application of a tellurium layer 17 of sufficient thickness (a 0.7 micron thickness layer of such tellurium was satisfactory in one exemplary embodiment of the invention where the memory semiconductor layer 16 was 1.5 microns thick), the threshold voltage of the memory device 1 stabilized after about 10–20 set-reset cycles, for the reasons explained in my co-pending application Ser. No. 396,497, filed Sept. 12, 1973. Over this tellurium layer 17 is shown deposited an outer electrode which includes an inner barrier-forming layer 18 of a refractory metal of molybdenum or the like overlaid by an outer highly conductive metal electrode layer 19 of aluminum or other highly conductive metal. The refractory metal layer 18 prevents migration of metal ions from the highly conductive electrode layer 19 of aluminum or the like into the memory semiconductor layer 16. As disclosed in co-pending application Ser. No. 396,497 filed Sept. 12, 1973, the molybdenum barrier-forming layer 18 is preferably deposited in a stress-free state by making the film thin (e.g., about 0.15 microns thick) or by using deposition equipment controlled in a manner to deposit thicker molybdenum films in a stress-free state. The enriched tellurium layer 17 most advantageously extends opposite substantially the entire outer surface area of the memory semiconductor layer 16 and the inner surface area of the barrier-forming refractory metal layer 18, so the tellurium region will be located at the termination of a filamentous current path 16*a* in the memory semiconductor layer 16 no matter where it is formed, and so it makes an extensive low resistance contact with the refractory metal layer 18. The tellurium layer 17 also lowers the overall resistance of the memory device 1 in the conductive state thereof.

The outer electrode layer 19 of aluminum or the like of each memory switch device in the matrix, which may be 2 microns thick to act as a good heat sink, connects to a deposited row or column conductor 23 deposited on the insulating layer 2*a*. Each *n* plus regions like 6 of the substrate 2 forms a column or row conductor of the matrix extending at right angles to the row or column conductor 23. Each row or column conductor like 23 of the matrix to which the outer electrode layer 19 of each memory switch device 1 is connected is coupled to one of the output terminals of a switching circuit 32' having separate inputs extending respectively directly or indirectly to one of the respective output terminals of set, reset and readout voltage sources 24, 26 and 30. The other terminals of these voltage sources may be connected to separate inputs of a switching circuit 32'' whose outputs are connected to the various *n* plus regions like 16 of the matrix. The switching circuits 32' and 32'' effectively connect one of the selected voltage sources 24, 26 or 30 to a selected row and column conductor of the matrix, to apply the voltage involved to the memory device connected at the crossover point of the selected row and column conductors. (In the alternative each of the set, reset and readout voltage sources 24, 26 and 30 can be replaced by separate voltage sources which produce voltages which are switched separately to all or selected row and column lines so all memory switch devices in a given row or column can be simultaneously set, reset or interrogated for a readout operation.)

In the reset state of the memory switch device 1, the memory semiconductor layer 16 thereof is mostly amorphous material throughout, and acts substantially as an insulator so that the memory switch device is in a very high resistance condition. However, when a set voltage pulse is applied across its electrodes, which exceeds the threshold voltage value of the memory switch device, current flows in a filamentous path 16*a* in the amorphous semiconductor layer 16 thereof which path is heated above its glass transition temperature. The filamentous path 16*a* is generally under 10 microns in diameter, the exact diameter thereof depending upon the value of the current flow involved. The current resulting from the application of the set voltage pulse source is generally well under 10 milliamps. Upon termination of the set voltage pulse because of what is believed to be the bulk heating of the filamentous path and the surrounding material due to the relatively long duration current pulse and the nature of the crystallizable amorphous composition of the layer 16, such as the germanium-tellurium compositions described, one or more of the composition elements, mainly tellurium in the exemplary composition previously described, crystallizes in the filamentous path. This crystallized material provides a low resistance current path so that upon subsequent application of the readout voltage from the source 30 current will readily flow through the filamentous path of the memory switch device 1.

The high or low resistance condition of the selected memory switch device 1 can be determined in a number of ways, such as by measuring the voltage across the memory switch device 1 where the readout voltage source 30 is a constant current source, or, as illustrated by providing a current transformer 43 or the like in the line extending from the readout voltage source 30 and providing a condition sensing circuit 43 for sensing the magnitude of the voltage generated in the transformer output. If the selected memory switch device 1 is in its set low resistance condition, the condition sensing circuit 43 will sense a relatively low voltage, and when the selected memory switch device 1 is in its reset high resistance condition it will sense a relatively large voltage. The current which generally flows through the filamentous path of the selected memory switch device 1 during the application of a readout voltage pulse is of a very modest level, such as 1 milliamp.

Figure 2:
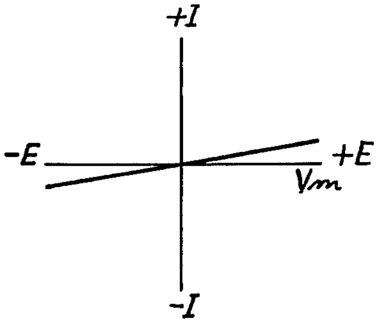
FIGS. 2 and 3 respectively illustrate the voltage current characteristics of the memory device of FIG. 1 respectively in the high and low resistance conditions thereof.
Figure 3:
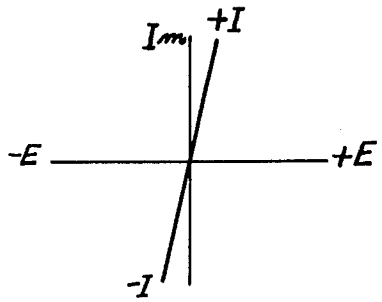

FIG. 2 shows the variation in current flow through the selected memory device 1 with the variation in applied voltage when the memory switch device is in its relatively high resistance reset condition, and FIG. 3 illustrates the variation in current with the variation in voltage applied across the device electrodes when the memory switch device is in its relatively low resistance set condition.

The amorphous memory semiconductor layer 16 can be reset from its relatively low to its high resistance condition by application of one or more reset pulses from the reset pulse source 26 in a manner well known in the art, or as disclosed, for example, in co-pending U.S. application Ser. No. 409,135 on Method and Means for Resetting Filament-Forming Memory Semiconductor Device filed Oct. 25, 1973 by Morrel H. Cohen or in co-pending application Ser. No. 410,412 on Method and Means for Resetting Filament-Forming Memory Semiconductor Device filed Oct. 29, 1973 by Jan Helbers. When one or more reset current pulses are fed through the amorphous semiconductor layer 16, the crystalline filament path previously formed may be partially or completely returned to an amorphous condition, re-establishing a relatively high resistance, non-conductive condition thereof.

The preferred memory semiconductor materials for the amorphous memory semiconductor layer 16 are tellurium based chalcogenide glass materials which have the general formula:

$$Ge_A Te_B X_C Y_D$$

where:

A=5 to 60 atomic percent

B=30 to 95 atomic percent

C=0 to 10 atomic percent when X is Antimony (Sb) or Bismuth (Bi)

or C=0 to 40 atomic percent when X is Arsenic (As)

D=0 to 10 atomic percent when Y is Sulphur (S) or D=0 to 20 atomic percent when Y is Selenium (Se).

A preferred composition is given by the following example:

$$Ge_{15}Te_{81}Sb_2S_2$$

The preferred process for forming the single crystal electrode in the embodiment of the invention shown in FIG. 1 will now be described. First, the desired electrode material is vapor or sputter deposited on the entire substrate without any special operating conditions (i.e., without the need for heating the substrate). The material, such as palladium, will combine with the silicon in the exposed single crystal substrate apertures involved to form a single crystal epitaxial layer which can be increased in thickness when subjected to an annealing operation. The other layers of the switch device, such as the amorphous semiconductor layer 16, the barrier-forming layer 17 and an aluminum layer 19 are then deposited and formed in any suitable well known manner, or by following the process described in copending U.S. application Ser. No. 264,937, filed June 21, 1972 on Film Deposited Semiconductor Device of Ronald G. Neale.

As a specific example of the process for growing an epitaxial layer 15 of palladium silicide, palladium (99.98%) was evaporated from a tungsten boat onto an unheated silicon ship substrate placed 7 inches from the source. The evaporation was performed in an oil diffusion pumped vacuum system. Prior to deposition the system was evacuated to approximately $2=10^{-6}$ Torr. Prior to the palladium deposition the silicon chip was chemically cleaned. An appreciable silicide layer was developed through a subsequent diffusion anneal of the silicon chip at 260°C for 10 minutes. Initially, this alloying was performed in an inert atmosphere. However, no detrimental effect was observed when the annealing was performed in air.

Surplus palladium metal was removed from between the substrate apertures by etching in an aqueous solution of potassium iodide and iodine, an etchant which does not attack palladium silicide. If the etchant was deficient in potassium iodide, a dark residue of palladium iodide remained on the silicide, which enabled poorly etched or improperly alloyed contacts to be detected in the optical microscope. The residual palladium iodide was removed with an etchant containing a surplus of potassium iodide. This procedure in turn eliminated the contact variability seen on some of the earlier contacts. The quality of the silicide surface was best revealed by scanning electron microscopy following the palladium removal.

Optimum conditions were determined on (111) plane silicon chips having 20 microns diameter apertures exposing p-type 0.001 ohm-cm boron doped regions. The electrodes were evaluated on a curve tracer for linearity and measurements were also made by the four point probe method of the forward voltage required to drive a current 1 milliamp through the electrodes. The results of these measurements are shown in the following table:

| Sample No. | Palladium thickness (nm) | Annealing temperature (°C) | Time (min) | Millivolts at 1 mA |
|---|---|---|---|---|
| 1 | 120 | 200 | 10 | 22±12 |
| 2 | 120 | 260 | 10 | 6.5±1 |
| 3 | 120 | 300 | 10 | 6.5±1 |
| 4 | 120 | 400 | 10 | 5.5±1 |
| 5 | 100 | 260 | 10 | 5.5±1 |
| 6 | 100 | 260 | 20 | 6.2±1 |
| 7 | 100 | 260 | 40 | 6.3±1 |
| 8 | 100 | 260 | 80 | 7.5±1 |
| 9 | 50 | 260 | 10 | 34±25 |
| 10 | 130 | 260 | 10 | 6±1 |
| 11 | 290 | 260 | 10 | 6.9±1 |

Each of the measurements in the voltage column is an average of 25 electrodes. The palladium thickness was determined from a glass monitor substrate placed alongside the silicon substrate during the deposition. A step was etched in the palladium film and a Sloan Dektak was used to measure the microtopography of the step. The thickness measurements are accurate to approximately 5 percent. All of the electrodes with the exception of samples 1 and 9 were linear on the curve tracer up to at least 100 milliamps. However, they all exhibited a small asymmetry with voltage reversal.

Samples 1–4 illustrate the effect of increasing annealing temperature. The contact voltage was essentially insensitive to annealing temperature above 260°C. The effect of increasing annealing time is illustrated by samples 5–8. In order to eliminate variations in contact due to variations in the silicon resistivity, samples 5 and 6 and samples 7 and 8 each consisted of two halves of the same chip. There is a general tendency for the voltage to increase with annealing time.

The effect of palladium thickness variations is illustrated by the last three samples. These three together with samples 5 indicate that the contact voltage is insensitive to palladium thicknesses of 100 *nm* or greater.

As noted above, annealing may be conveniently performed at 260°C for 10 minutes in air in a laboratory oven.

Thus, the present invention has provided a highly useful and unique electrode for amorphous threshold and memory switch-forming semiconductor devices, and a method of making such electrodes on a single crystal substrate. While the process of forming a palladium silicide electrode in a single crystal silicon substrate has one of its most important utilities where such electrodes form a single layered interface between an amorphous semiconductor material as described and an electrical circuit element integrated into the single crystalline silicon substrate, the unique low temperature deposition and annealing process aspect of the invention also has application generally in the making of electrical contacts on single crystal substrates like silicon chip substrates as well as a single layered interconnection between a deposited amorphous semiconductor switch device and one or more conductive points in the substrate.

It should be understood that numerous modifications may be made to the forms of the invention described above without deviating from the broader aspects thereof.

I claim:

1. A switch device comprising in combination, a substrate, a glassy film of amorphous semiconductor switch material on said substrate and forming the active switch material of the device, and a pair of spaced apart electrodes in contact with said film of amorphous semiconductor material to form the electrodes of the switch device, the amorphous semiconductor material and electrodes contacting one another along a smooth interface, at least one of said electrodes being a single crystal of a metal silicide material which is nonreactive with and is otherwise compatible with said amorphous semiconductor material, said amorphous semiconductor switch material being of relatively high resistance, and at least one current conducting path of relatively low resistance being established between the electrodes in response to the application of a voltage to the electrodes above a threshold voltage value.

2. A switch device as defined in claim 1 wherein said at least one conducting path of relatively low resistance of the semiconductor material remains in a relatively low resistance conducting state even though the current therethrough decreases to zero, and realters from said at least one conducting path of relatively low resistance to a relatively high resistance blocking state in response to a reset current pulse applied to the electrodes.

3. The switch device of claim 1 wherein said at least one electrode comprises a single metal silicide crystal layer grown on said substrate.

4. The switch device of claim 3 wherein said substrate is a silicon chip and said single crystal layer is a platinum or noble metal silicide.

5. The switch device of claim 1 wherein said at least one electrode comprises a single crystal epitaxial metal silicide layer on said substrate, the epitaxial layer comprising a deposited metal diffused into the single crystal semiconductor substrate and annealed to increase the thickness thereof.

6. The switch device of claim 1 wherein said substrate is a silicon chip and said single crystal layer is palladium silicide.

7. In an integrated circuit comprising a semiconductor substrate and at least one doped current carrying device-forming region exposed through an associated aperture in an insulating surface on the substrate, and a film of an ohmic contact electrode-forming material in said aperture and making electrical contact with the current carrying devices formed by the doped region in said substrate, the improvement wherein there is deposited directly upon said ohmic contact-forming deposit an amorphous semiconductor switch-forming material upon which is also deposited an ohmic contact electrode-forming material having a smooth face contacting the same, said deposit of amorphous semiconductor material being of a relatively high resistance and including means for establishing at least one current conducting path of relatively low resistance between the electrodes thereof in response to the application of the voltage to the electrodes above a threshold voltage value, said ohmic contact electrode in said aperture of said substrate being a single crystal of a metal silicide material which has a smooth face contacting a smooth face of said amorphous semiconductor material.

8. The switch device of claim 7 wherein said electrode comprises a single crystal metal silicide epitaxial layer on said substrate which is a single crystal semiconductor substrate, the epitaxial layer comprising a deposited metal diffused into the single crystal semiconductor substrate and annealed to increase the thickness thereof.

9. The switch device of claim 7 wherein said substrate is a silicon chip and said single crystal layer is a platinum or noble metal silicide.

10. The integrated circuit of claim 7 wherein said substrate is doped silicon, said single crystal deposit of ohmic contact-forming material in each of said substrate apertures is a single crystal of palladium silicide formed as an epitaxial layer of the associated doped region of the substrate, and said amorphous semiconductor material is a chalcogenide glass having the general formula:

$$Ge_A Te_B X_C Y_D$$

where:

A=5 to 60 atomic percent

B=30 to 95 atomic percent

C=0 to 10 atomic percent when X is Antimony (Sb) or Bismuth (Bi)

or C=0 to 40 atomic percent when X is Arsenic (As)

D=0 to 10 atomic percent when Y is Sulphur (S)

or D=0 to 20 atomic percent when Y is Selenium (Se).

* * * * *